United States Patent [19]
Cunningham et al.

[11] Patent Number: 5,688,699
[45] Date of Patent: Nov. 18, 1997

[54] MICROBOLOMETER

[75] Inventors: Brian T. Cunningham, Stowe, Mass.; Bharat L Patel, Nashua, N.H.

[73] Assignee: Raytheon Company, Lexington, Mass.

[21] Appl. No.: 591,198

[22] Filed: Jan. 16, 1996

[51] Int. Cl.⁶ .................................................. H01L 31/18
[52] U.S. Cl. ...................... 437/3; 437/2; 437/4; 437/903
[58] Field of Search ............................. 437/2, 3, 4, 903, 437/921; 148/DIG. 12, DIG. 80

[56] References Cited

U.S. PATENT DOCUMENTS

| | | | |
|---|---|---|---|
| 4,544,441 | 10/1985 | Hartmann et al. | 437/3 |
| 4,640,629 | 2/1987 | Antonini et al. | 437/903 |
| 5,260,225 | 11/1993 | Lin et al. | 437/3 |
| 5,264,375 | 11/1993 | Bang et al. | 437/3 |
| 5,288,649 | 2/1994 | Keenan | 437/3 |
| 5,529,949 | 6/1996 | Stan et al. | 432/100 |
| 5,602,043 | 2/1997 | Beratan et al. | 437/3 |
| 5,627,112 | 5/1997 | Tennant et al. | 437/921 |

*Primary Examiner*—Kevin Picardat
*Attorney, Agent, or Firm*—Donald F. Mofford

[57] ABSTRACT

A method is provided for forming a bolometer having an infrared sensitive material disposed on a platform elevated over a surface of a semiconductor body. The method includes forming a thermally insulating support layer to provide the platform and legs for supporting the platform over the semiconductor body. A layer of electrically conductive material is formed over the support layer and onto electrical contacts of an electronic circuit formed in the semiconductor body. The layer of electrically conductive material is patterned into electrical conductors passing, at a proximal end thereof, from the contact region of the electronic circuit upwardly to, at the distal end thereof, the platform region. The patterned electrically conductive layer is used as a mask for selectively removing portions of the support layer exposed by the patterned electrically conductive layer while portions of the support layer remain disposed under such patterned electrically layer.

15 Claims, 5 Drawing Sheets

MICROBOLOMETER

BACKGROUND OF THE INVENTION

This invention relates generally to microbolometers and more particularly to microbolometers having an infrared energy detecting material suspended over a semiconductor body, such semiconductor body having formed therein electronic circuitry electrically coupled to the infrared energy detecting material.

As is known in the art, semiconductor manufacturing methods are being used to form various microstructures. One such microstructure is a microbolometer used to detect infrared energy. More particularly, an array of such devices is formed integrally with an integrated circuit. The integrated circuit is used to develop signals produced by the microbolometer in response to the infrared energy impinging on the array thereof. In one such array, each one of the microbolometers includes an infrared receiving surface. The surface is made of a material which has its resistivity change as the temperature of the material increases in response to the infrared energy impinging on, and absorbed by, the material. One such material is vanadium oxide. Thus, by placing the material in series with a voltage supply, the current through the material will vary in accordance with the infrared energy sensed by the material. Electronic read circuitry connected by the voltage supply and serially connected temperature sensitive resistive material is used to produce an output signal representative of the infrared energy impinging on the material. The array of bolometer, together with its output electrical signals, and a processor fed by the output electrical signals can thus be used to provide an electronic image of the source of the infrared energy.

As noted above, in some applications, integrated circuit fabrication techniques have been used to form the array of bolometers integrally with the associated electronics read out circuitry. In such application, a substrate, or semiconductor layer, has been formed as an integrated circuit with the read out electronics. More particularly, the read out electronics includes an array of read out cells, each one thereof corresponding to one of the bolometers in the array. Each read out cell includes as pair of electrical contacts formed on the upper surface of the semiconductor layer for electrical connection to a corresponding one of the bolometers in the array thereof. Each one of the bolometers includes a thermal insulating, dielectric platform integrally formed over the semiconductor layer. The platform is formed using integrated circuit photolithographic techniques, i.e., sequential photolithographic masking and patterning of layers by chemical etching and/or liftoff techniques. Using such techniques, the platform is formed with a pair of legs with proximal ends thereof disposed on the surface at positions adjacent the electrical contacts on the semiconductor layer. The distal ends are formed so that the distal ends of the legs are elevated over the surface of the substrate. Integrally formed with the legs is a planar square, or rectangular shaped surface member, or platform. Opposing corners of the surface member terminate into the distal end of the pair of legs. Thus, the surface member, or platform, is suspended by the legs, as an air bridging surface, over the surface of the substrate. The temperature sensitive resistive material is formed over the surface member. Electrical conductors are formed over the legs, proximal ends of the conductors being in electrical contact with the electrical contacts and the distal ends being electrically connected to the portion of the temperature sensitive resistive material adjacent to the distal ends of the legs. Such arrangement suspends the temperature sensitive resistive material on the elevated, air-bridging surface member from the substrate to thereby increase its thermal isolation from the substrate. The increased thermal isolation thereby increases the sensitivity of the bolometer to the impinging infrared energy. One such structure is described in U.S. Pat. No. 5,399,897, "Microstructure and Method of Making Such Structure", issued Mar. 21, 1995, inventors, Brian T. Cummingham and Patricia V. Richard, assigned to the same assignee as the present invention.

SUMMARY OF THE INVENTION

In accordance with the present invention, a method is provided for forming an bolometer having an infrared sensitive material disposed on a platform elevated over a surface of a semiconductor body. The method includes forming a thermally insulating support layer to provide the platform and legs for supporting the platform over the semiconductor body. A layer of electrically conductive material is formed over the support layer and onto electrical contacts of an electronic circuit formed in the semiconductor body. The layer of electrically conductive material is patterned into electrical conductors passing, at a proximal end thereof, from the contact region of the electronic circuit upwardly to, at the distal end thereof, for electrical connection to the formed infrared sensitive material on the platform region. The patterned electrically conductive layer is used as a mask for selectively removing portions of the support layer exposed by the patterned electrically conductive layer while portions of the support layer remain disposed under such patterned electrically layer.

With such an arrangement, the patterning of the support layer is self aligned to the patterned electrically conductive layer.

In a preferred embodiment, the exposed portions of the support layer are selectively removed by subjecting the structure to reactive ion etching.

BRIEF DESCRIPTION OF THE DRAWING

Other features of the invention will become more readily apparent with reference to the following drawings, in which.

DESCRIPTION OF THE PREFERRED EMBODIMENTS

Figure 1:
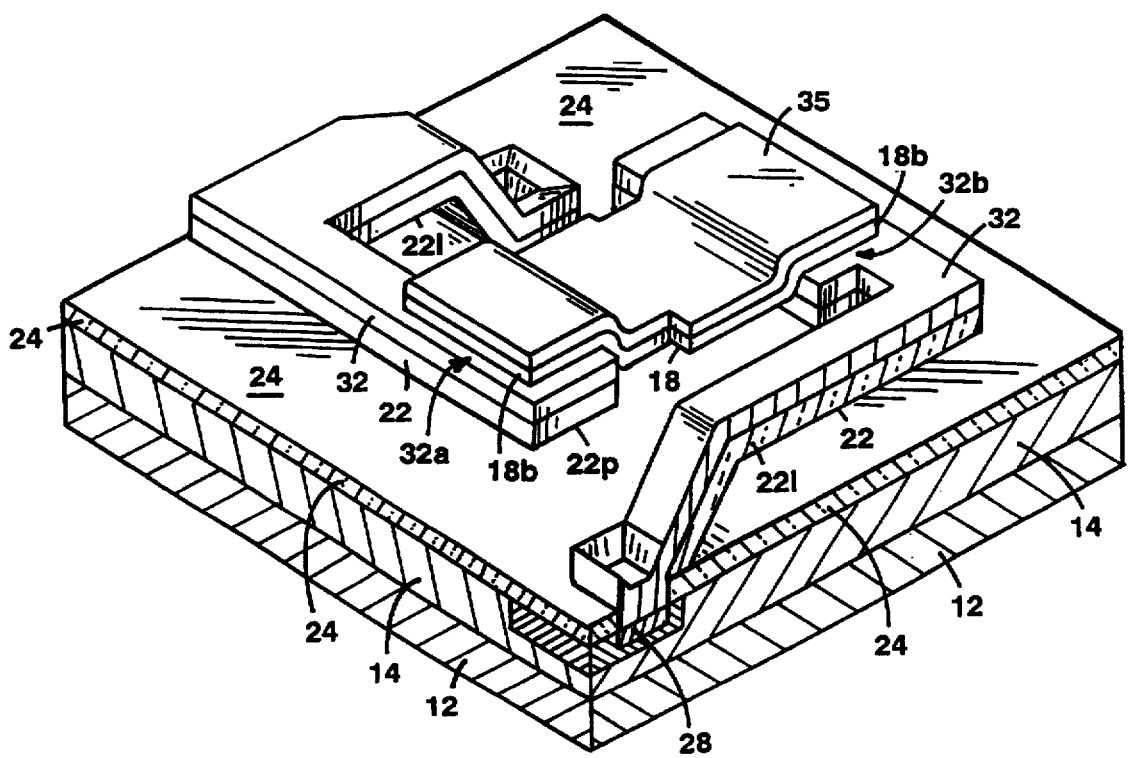
FIG. 1 is an isometric, partially cross-sectioned, diagrammatical sketch of a microbolometer in accordance with the invention.

Referring now to FIG. 1, a microbolometer 10 is shown. The microbolometer 10 includes: a silicon substrate 12 with an electronic circuit, not shown, formed in an epitaxial layer 14 thereof; and, a pad of infrared sensing material 18, here vanadium oxide, suspended over a surface of the substrate 12 on a platform 22l supported by a pair of support legs 221, as shown. The support legs 221 and the platform 22p are patterned from a single layer 22 of thermally insulating material, here silicon nitride, in a manner to be described in connection with FIGS. 2A–2H. Suffice it to say here, however, that the support layer 22 has a thickness suitable to support the platform 22p and the infrared energy sensing pad 18. The pad of infrared sensing material 18 is electrically connected at opposite sides 18a, 18b, thereof to electrical contact regions 28 by two electrically separated sections 32a, 32b, of a patterned layer 32 of electrically conductive material disposed on upper portions of the insulating layer 22, as shown. The electrically conductive material of layer 32 is here chromium-nickel. The electrically conductive material of layer 32 and the insulating layer 22 are patterned in a manner to be described in detail in connection with FIGS. 2A though 2H. Suffice it to say here, however, that each one of the pair of electrically conductive sections 32a, 32b is electrically connected to a corresponding, opposing, peripheral portion 18a, 18b of the of vanadium oxide, infrared sensing material layer 18, as shown. Thus, the distal ends 32a, 32b of the patterned electrically conductive layer 32 are electrically connected to opposing, peripheral portions 18a, 18b, respectively. Further, the proximal ends of the patterned electrically conductive layer 32 are electrically connected to contact regions 28 and thus to the electronic circuit formed in the epitaxial layer 14.

Figure 2A:
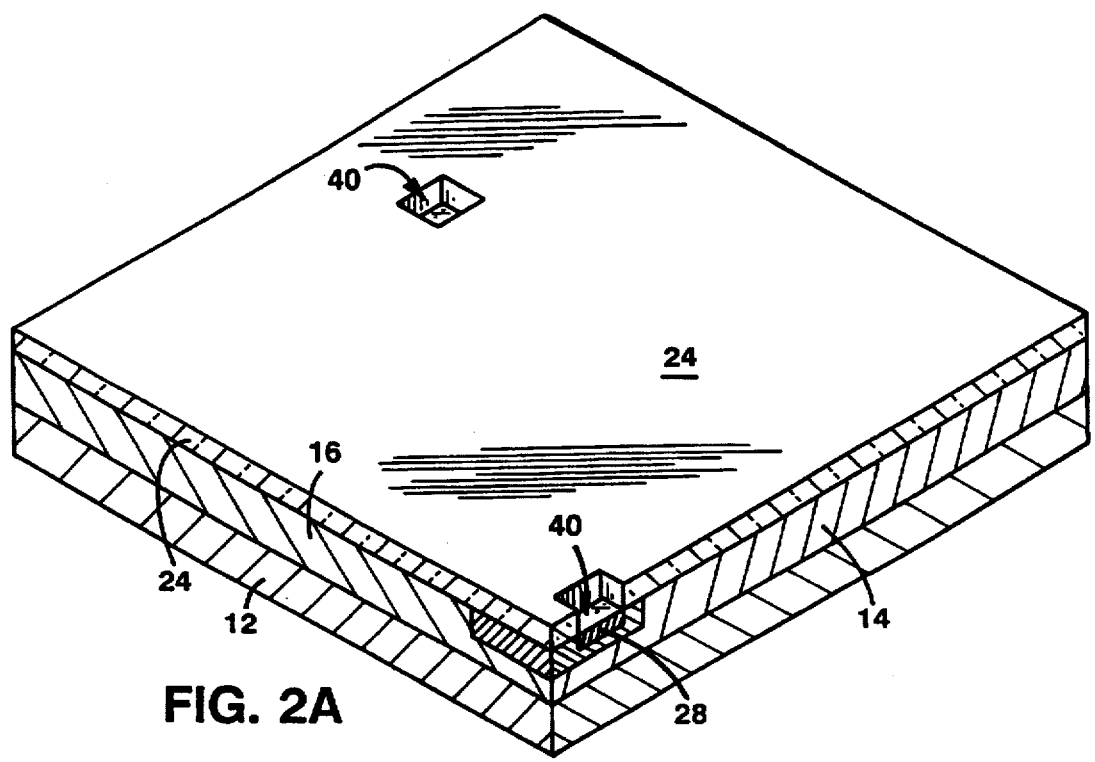
FIGS. 2A–2H are isometric, diagrammatical sketches of microbolometer of FIG. 1 at various stages in the fabrication thereof.

Referring now in more detail to FIGS. 2A through 2H, the method of forming bolometer 10 will be described. Thus, as shown in FIG. 2A, a substrate 12 of silicon having an epitaxial layer 14 with the electronic circuit, not shown, formed therein, and an insulating layer 24, here of silicon dioxide, is patterned with openings 40 over the electrical contact regions 28, is provided.

Figure 2B:
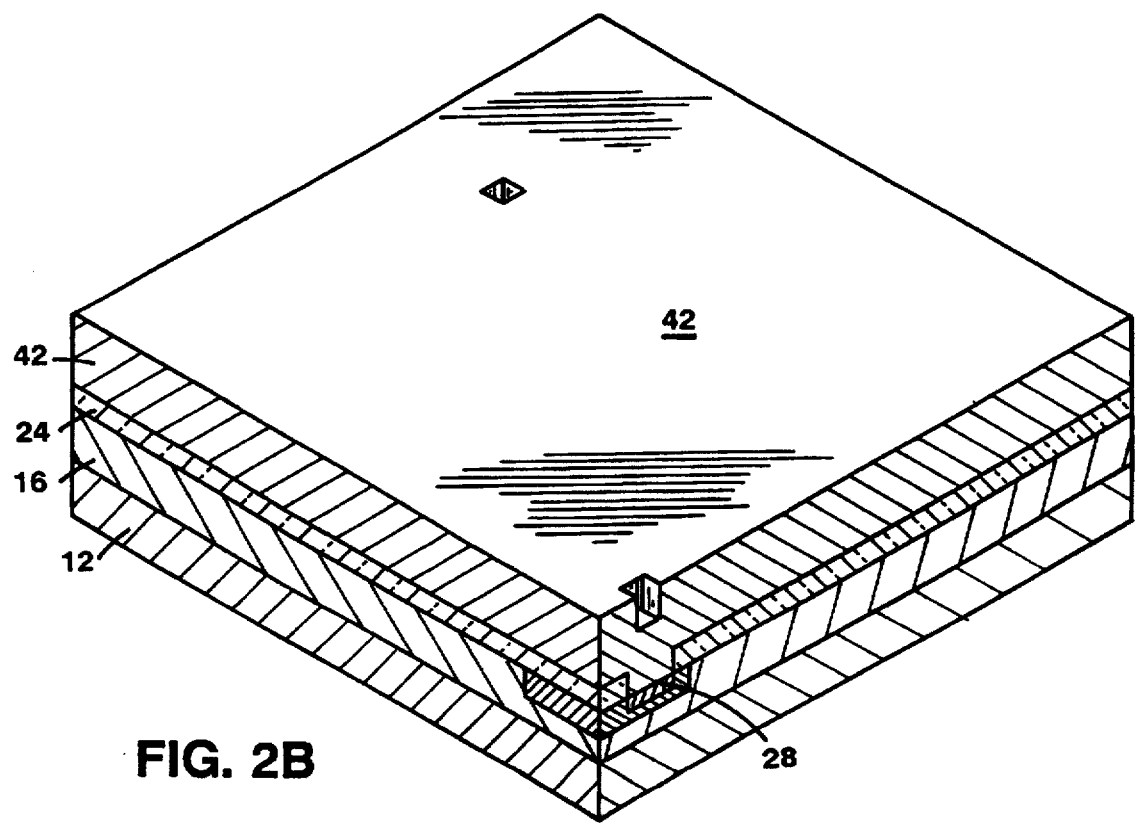
Figure 2C:
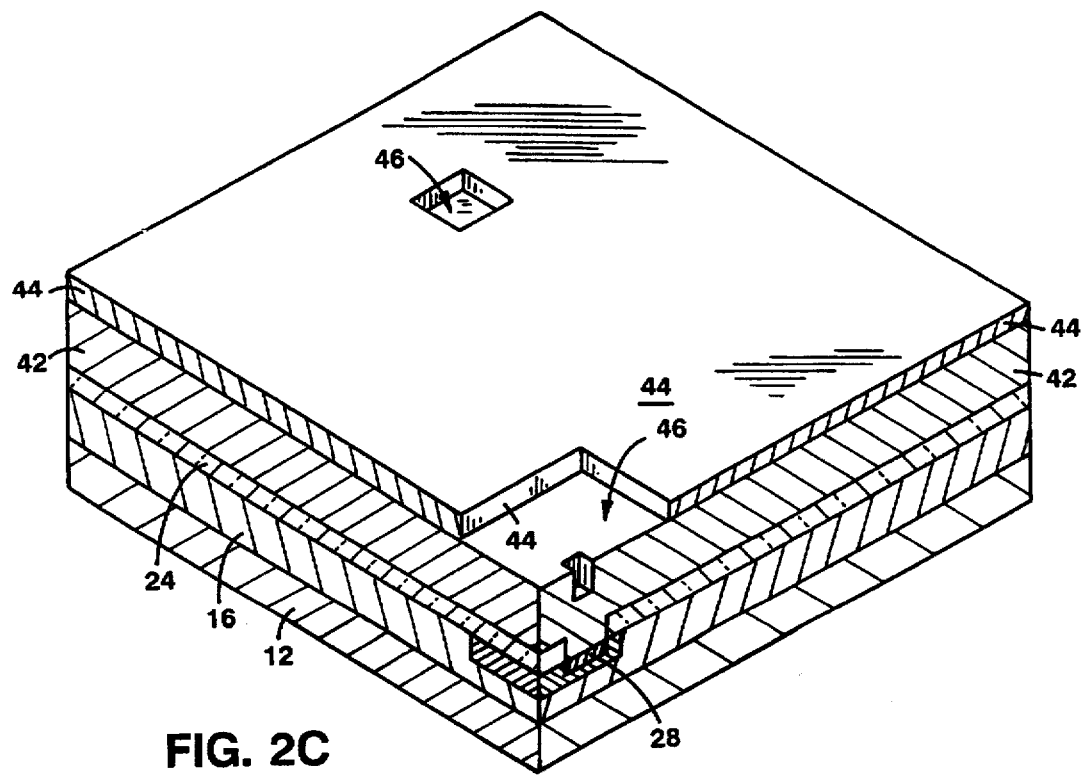
Figure 2D:
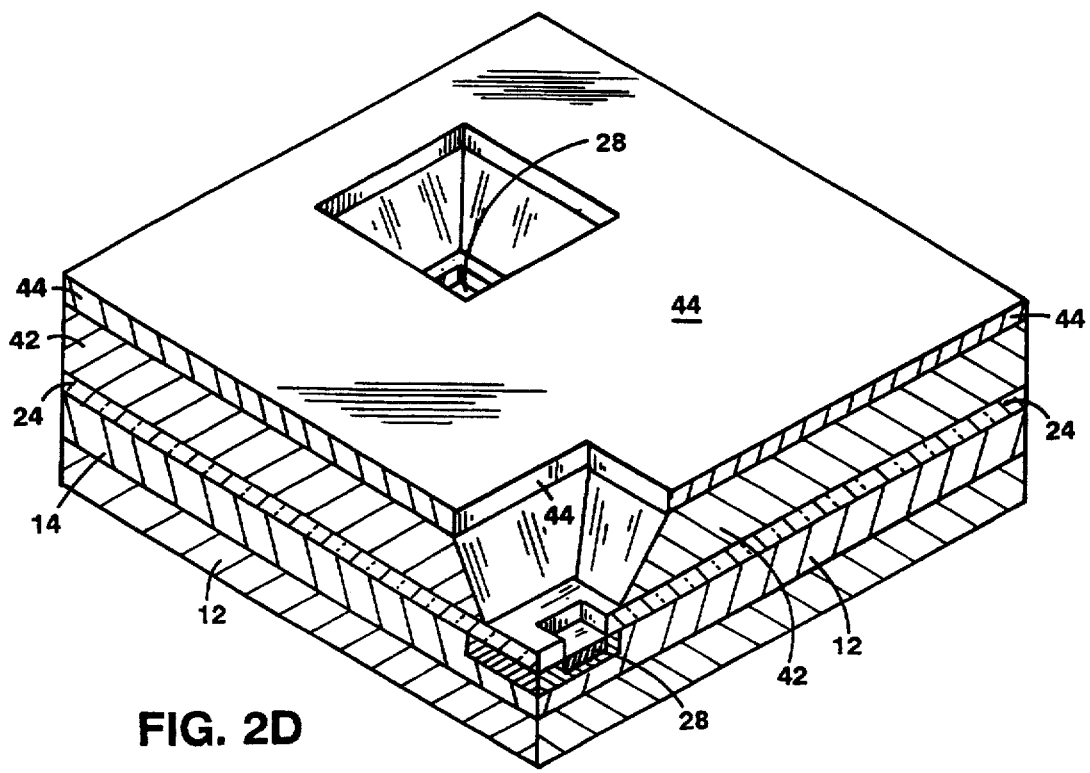

Next, as shown in FIG. 2B, a removable, or sacrificial layer 42, here a polyamide is spun onto the surface of layer 24, as shown. The removable layer is then patterned, using conventional photolithographic-chemical, and reactive ion, etching processing with an aluminum mask 44 having openings 46 formed therein over electrical contact regions 28 to the electrical circuit, as shown in FIG. 2C. The resulting structure is shown in FIG. 2D.

Figure 2E:
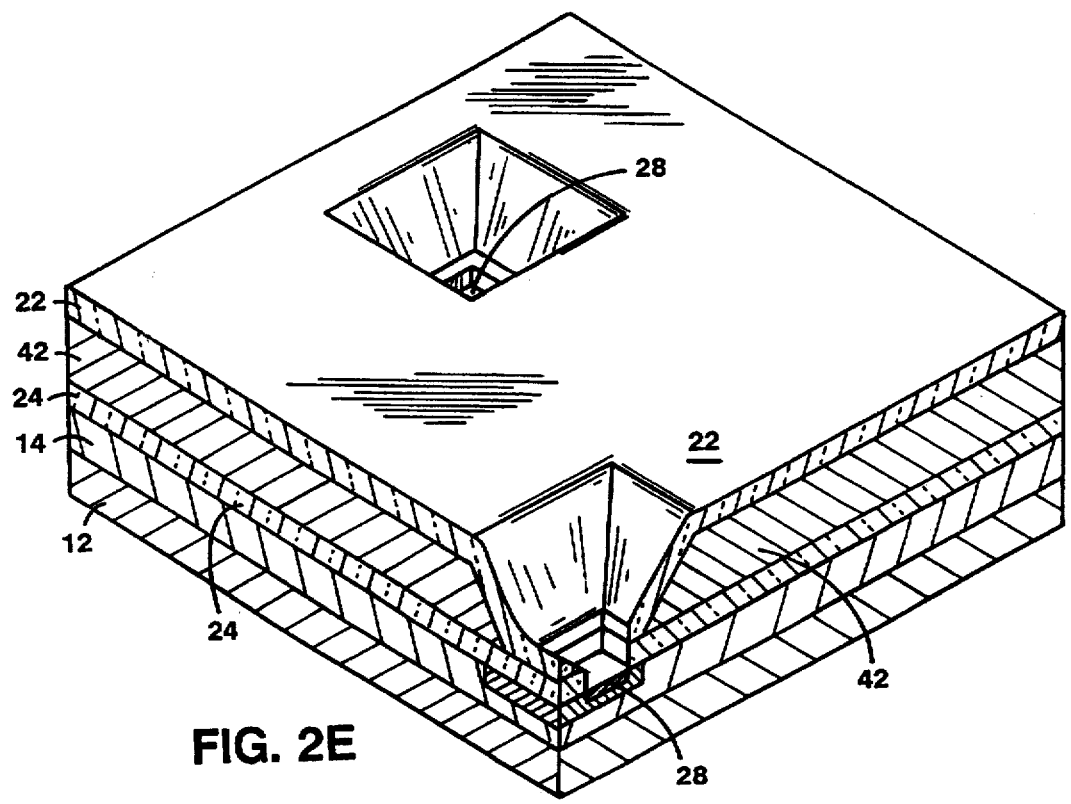

Next, the layer of layer 44 of aluminum is removed using any conventional aluminum etchant, here a solution of $HNO_3$, acetic acid, $H_3PO_4$ and $H_2O$, and a layer 22 of thermally insulating material, here silicon nitride having a thickness of 5000A, is deposited over the surface of the structure by plasma enhancement chemical vapor deposition (PECVD), and patterned, using a reactive ion etch process, to have openings 29 to expose the contact regions 28 as shown in FIG. 2E.

Figure 2F:
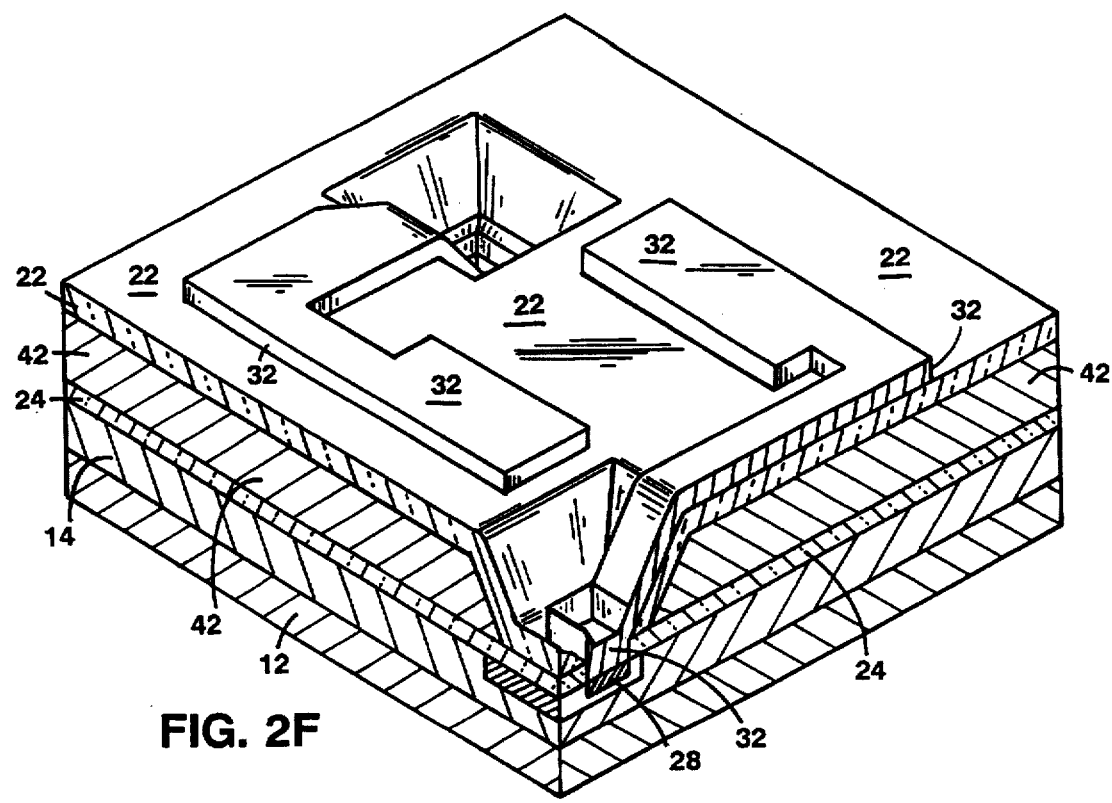

Next, a layer of photoresist, not shown, is deposited over the structure shown in FIG. 2E and patterned with openings in regions where the metal layer 32 (FIG. 1) is to be formed. Next, the layer 32 of electrically conductive material, here chromium having a thickness of 100 A and nickel having a thickness of 200A is deposited over the patterned photoresist layer on through the openings therein onto the exposed contact regions 28. The photoresist layer, not shown, is then lifted off the structure along with the portions of the metal layer 32 disposed on it thereby leaving the patterned layer 32 of metal as shown in FIG. 2F.

Next, a filler metal, not shown, is deposited over the portions of the metal layer disposed over the contact regions 28. The metal filler layer, not shown, is patterned using a lift off technique as described above. Here, the filler metal, not shown, is chromium having a thickness of 100A and gold having a thickness of 1.0 micrometers.

Next, the layer 18 (FIG. 1) of infrared sensing material, here vanadium oxide, is deposited over the structure, here using pulsed plasma laser deposition (PLD) technique in an oxygen argon atmosphere. The thickness of the vanadium oxide is here selected to provide a resistance of 15–30 Kohms/square.

Figure 2G:
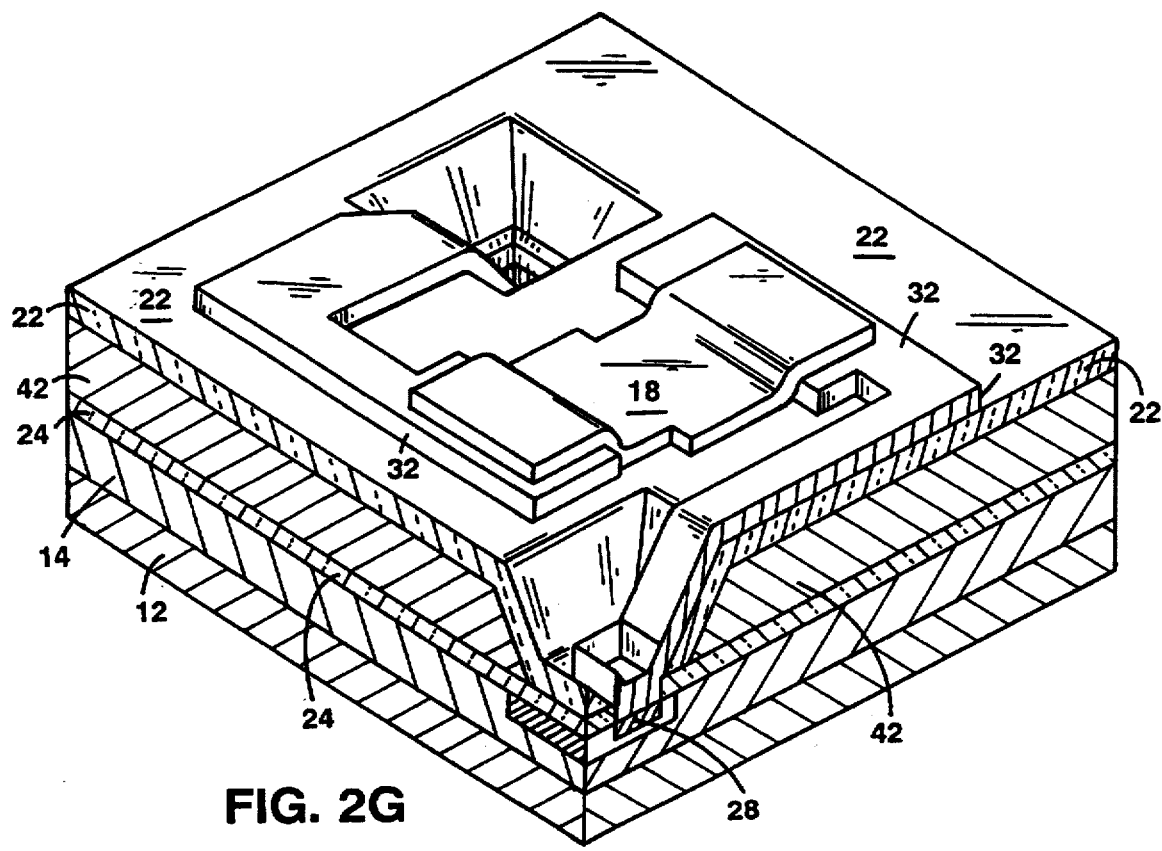

The layer 18 of vanadium oxide is then patterned using a mask, not shown, having a windows exposing the portions of the deposited vanadium oxide layer which are to be removed; i.e., the pad region of the mask is covered with photoresist. The exposed portions of the vanadium oxide layer 18 are removed with a solution of, here, $HNO_3$, acetic acid, $H_3PO_4$ and $H_2O$ $H_3PO_4$. The resulting structure thus has a patch of infrared sensitive material 35, as shown in FIG. 2G.

Figure 2H:
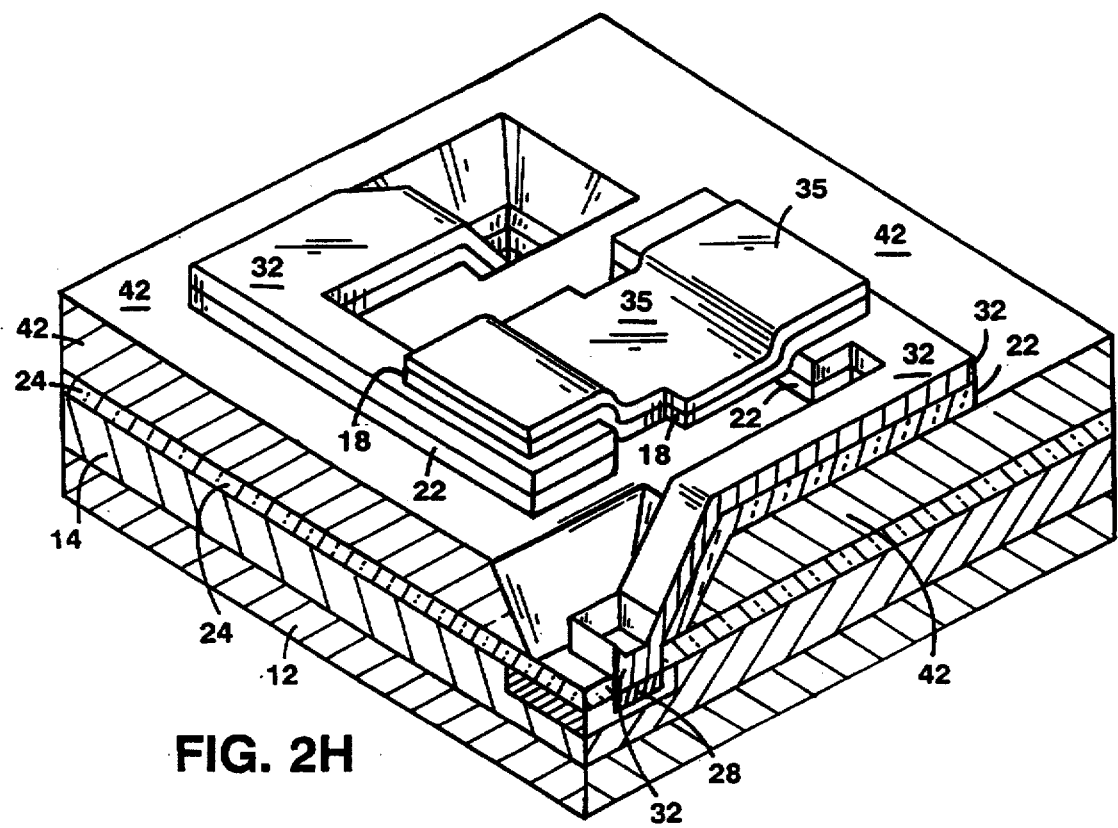

Next, the layer 35 (FIG. 1) of silicon nitride, here 1000A is deposited over the structure using plasma enhanced chemical vapor deposition (PECVD). A layer of photoresist, not shown, is deposited over the structure and patterned to cover the portion of silicon nitride layer 35 disposed over the layer 18 of vanadium oxide, i.e., over the patch of vanadium oxide infrared sensitive material 35. The surface of the structure is then subjected to a reactive ion etch (RIE). The RIE is used to etch 6000A of silicon nitride (i.e., the portions of the 5000A thick silicon nitride layer 22 exposed by the patterned metal layer 32 and the portions of the 1000A thick silicon nitride layer 35 exposed by the photoresist). The photoresist layer is removed and the resulting structure is shown in FIG. 2H. It is noted that the patterned metal layer 22 provides a self aligning mask for patterning the silicon nitride layer 22.

Next, an absorber layer, not shown, of 100 A thick gold is patterned on the layer 35 of silicon nitride using a lift off technique.

Next, the sacrificial layer 42 is removed using an oxygern plasma to produce the structure shown, and described in connection with, FIG. 1.

Other embodiments are within the spirit and scope of the appended claims. For example, a mirror, not shown, of evaporated chromium, 50A thick, and platinum 500A thick, is formed using a lift off technique prior to depositing the polyamide layer 42. Thus, the bolometer 10 will, after removal of layer 42, have a mirror portion disposed under the pad of infrared sensing vanadium oxide material 18.

What is claimed is:

1. A method for forming a bolometer having an infrared sensitive material disposed on a platform elevated over a surface of a semiconductor body, comprising the steps of:

forming a thermally insulating support layer to provide the platform and legs for supporting the platform over the semiconductor body;

patterning a layer of electrically conductive material over the support layer and into electrical connection with contacts for an electronic circuit formed in the semiconductor body, and for electrical connection with the infrared sensitive material;

using the patterned electrically conductive layer as a mask for selectively removing portions of the support layer exposed by the patterned electrically conductive layer while portions of the support layer remain disposed under such patterned electrically conductive layer.

2. The method recited in claim 1 wherein the exposed portions of the support layer are selectively removed by subjecting the structure to reactive ion etching.

3. A method for forming a bolometer having an infrared sensitive material disposed on a platform elevated over a surface of a semiconductor body, comprising the steps of:

forming a thermally insulating support layer to provide the platform and legs for supporting the platform over the semiconductor body;

forming a layer of electrically conductive material over the support layer and onto electrical contact region for an electronic circuit formed in the semiconductor body, the layer of electrically conductive material being patterned into electrical conductors passing, at a proximal end thereof, from the contact regions of the electronic circuit upwardly to, at the distal end thereof, the platform region for electrical connection to the infrared sensing material;

using the patterned electrically conductive layer as a mask for selectively removing portions of the support layer exposed by the patterned electrically conductive layer while portions of the support layer remain disposed under such patterned electrically conductive layer.

4. The method recited in claim 3 wherein the exposed portions of the support layer are selectively removed by subjecting the structure to reactive ion etching.

5. A method for forming an integrated circuit structure, comprising the steps of:

providing a substrate having a semiconductor material with an electronic circuit formed in such material;

forming a support layer of thermally insulating material over the substrate, such layer having an opening formed therein exposing an electrical contact regions to the electronic circuit;

forming a patterned layer of electrically conductive material over the support layer with proximal ends thereof in electrical contact with the exposed contact region to the electronic circuit, such electrically conductive material being pattern with distal ends thereof formed in different, separated regions on the platform of the thermally insulating layer;

using the patterned electrically conductive layer as a mask for selectively removing portions of the support layer exposed by the patterned electrically conductive layer while leaving portions of the support layer under such patterned electrically conductive layer.

6. The method recited in claim 5 including the step of forming a patch of infrared sensing material over end of the separated, distal portions of the patterned electrically conductive layer.

7. The method recited in claim 6 wherein the support layer is deposited to a thickness sufficient to support the patch over the substrate.

8. The method recited in claim 7 wherein the step of selectively removing portions of the support layer exposed by the patterned layer of electrically conductive material includes the step of subjecting the structure to reactive ion etching.

9. The method recited in claim 8 including the steps of:

providing a protective layer over the pad and surface portions adjacent to the patch;

providing a mask over the patch; and selectively removing portions of the protective layer exposed by the mask and subsequently selectively removing portions of the support layer exposed by the patterned layer of electrically conductive layer by subjecting the structure to the aforementioned reactive ion etching.

10. The method recited in claim 9 wherein the material of the protective layer is the same as the material of the insulating layer.

11. A method for forming an integrated circuit, comprising the steps of:

providing a substrate having a semiconductor material with an electronic circuit formed in such material;

forming a removable support layer over a surface of the substrate, such removable support layer having an opening formed therein exposing an electrical contact region to the electronic circuit;

forming a layer of insulating material over the removable support layer, such layer of insulating material having an opening formed therein exposing the electrical contact region to the electronic circuit;

forming a patterned layer of metal over the insulating layer into two separated regions each with proximal ends being on the exposed contact region to the electronic circuit and distal ends being disposed on the two different regions of the platform;

forming a layer of infrared sensing material over the layer of metal with peripheral portions thereof in electrical contact with a corresponding one of the different separated regions of the patterned layer of metal, such infrared material into a patch of such material;

using the patterned layer of metal as a mask for selectively removing portions of the insulating layer exposed by the patterned layer of metal; and, removing the removable support layer leaving the infrared sensing patch, portions of the insulating layer disposed under such patch, and distal portions of the patterned layer of metal suspended over the substrate with proximal ends of such patterned layer of metal in electrical contact with the electrical contact regions of the electronic circuit.

12. The method recited in claim 11 wherein the insulating layer is a material selected to support the distal end of the patterned layer of metal, and the patch, suspended over the substrate.

13. The method recited in claim 12 wherein the step of selectively removing portions of the insulating material exposed by the patterned layer of metal includes the step of subjecting the structure to reactive ion etching.

14. The method recited in claim 13 including the steps of:

proving a protective layer over the patch and portions adjacent such patch;

providing a mask over the patch; and selectively removing portions of the protective layer exposed by the mask and subsequently selectively removing portions of the support layer exposed by the patterned metal layer by subjecting the structure to the aforementioned reactive ion etching.

15. The method recited in claim 14 wherein the material of the protective layer is the same as the material of the insulating layer.

* * * * *